United States Patent
Jiang et al.

(10) Patent No.: US 9,761,615 B2
(45) Date of Patent: Sep. 12, 2017

(54) ARRAY SUBSTRATE, MANUFACTURING METHOD THEREOF AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xiaohui Jiang, Beijing (CN); Changjiang Yan, Beijing (CN); Jiaxiang Zhang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/769,658

(22) PCT Filed: Oct. 27, 2014

(86) PCT No.: PCT/CN2014/089549
§ 371 (c)(1),
(2) Date: Aug. 21, 2015

(87) PCT Pub. No.: WO2016/026207
PCT Pub. Date: Feb. 25, 2016

(65) Prior Publication Data
US 2016/0247835 A1    Aug. 25, 2016

(30) Foreign Application Priority Data
Aug. 21, 2014    (CN) .......................... 2014 1 0415652

(51) Int. Cl.
*H01L 27/12* (2006.01)
*H01L 21/77* (2017.01)
(Continued)

(52) U.S. Cl.
CPC .... *H01L 27/1248* (2013.01); *H01L 21/31116* (2013.01); *H01L 21/31138* (2013.01);
(Continued)

(58) Field of Classification Search
CPC ......................... H01L 29/78633; H01L 27/124
See application file for complete search history.

(56) References Cited

U.S. PATENT DOCUMENTS

| | | | |
|---|---|---|---|
| 2007/0023760 A1 | 2/2007 | Kim et al. | |
| 2014/0159070 A1* | 6/2014 | Hoka | H01L 27/124 257/88 |
| 2015/0021630 A1* | 1/2015 | Jang | G02F 1/136227 257/88 |

FOREIGN PATENT DOCUMENTS

| | | |
|---|---|---|
| CN | 1195192 A | 10/1998 |
| CN | 1575525 A | 2/2005 |

(Continued)

OTHER PUBLICATIONS

International Search Report and Written Opinion both dated May 26, 2015; PCT/CN2014/089549.
(Continued)

*Primary Examiner* — Tran Tran
(74) *Attorney, Agent, or Firm* — Ladas & Parry LLP

(57) ABSTRACT

An array substrate, a manufacturing method thereof and a display device are disclosed. The array substrate comprises: a base substrate (1), thin-film transistors (TFTs), an isolation layer (10) and an organic resin layer (8) formed on the base substrate (1), and a common electrode layer (12) formed on the organic resin layer (8). The isolation layer (10) covers source electrodes (6) and drain electrodes (7) of the TFTs; the organic resin layer (8) covers the isolation layer (10) and is provided with first through holes (9) corresponding to the drain electrodes (7) of the TFTs; the isolation layer (10) is provided with second through holes (11) communicated with (Continued)

the first through holes (9) to expose partial drain electrodes (7); and the dimension of the second through holes (11) is greater than that of the first through holes (9). The array substrate, the manufacturing method thereof and the display device resolve the problem of forming dark dots, ensure the product quality, reduce the waste of production materials, and reduce the production cost.

9 Claims, 2 Drawing Sheets

(51) Int. Cl.
*H01L 21/311* (2006.01)
*H01L 21/768* (2006.01)

(52) U.S. Cl.
CPC ........ *H01L 21/76816* (2013.01); *H01L 21/77* (2013.01); *H01L 27/12* (2013.01); *H01L 27/1262* (2013.01); *Y02P 80/30* (2015.11)

(56) References Cited

FOREIGN PATENT DOCUMENTS

| CN | 101393363 A | 3/2009 |
| CN | 101604695 A | 12/2009 |
| CN | 102468308 A | 5/2012 |
| CN | 102487044 A | 6/2012 |
| CN | 103676354 A | 3/2014 |

OTHER PUBLICATIONS

Second Chinese Office Action dated Jan. 13, 2017; Appln. No. 201410415652.1.
The Third Chinese Office Action dated Jul. 4, 2017; Appln. No. 201410415652.1.

* cited by examiner

ARRAY SUBSTRATE, MANUFACTURING METHOD THEREOF AND DISPLAY DEVICE

TECHNICAL FIELD

Embodiments of the present invention relate to an array substrate, a manufacturing method thereof and a display device.

BACKGROUND

With the continuous development of liquid crystal display (LCD) technology, the requirement on the resolution of display devices is becoming higher and higher. Currently, full high definition displays have become the mainstream. FIG. 1 is a schematic structural view of an array substrate of a high-definition (HD) display device. In order to obtain a full high definition display device, as illustrated in FIG. 1, an organic resin layer 8 need be formed on source electrodes 6 and drain electrodes 7 of thin-film transistors (TFTs) to reduce the power consumption of the array substrate and increase the aperture ratio. Meanwhile, a through hole need be formed to connect the drain electrode and a pixel electrode layer 14. Finally, a voltage difference is produced across a common electrode layer 12 and the pixel electrode layer 14. Therefore, the normal display of the sub-pixel function can be guaranteed.

SUMMARY

At least one embodiment of the present invention provides an array substrate, a manufacturing method thereof and a display device, which solve the problem that: in an HD display device, drain electrodes will be communicated with a common electrode layer which is hence communicated with a pixel electrode layer, so that the normal display of the sub-pixel function cannot be achieved, and hence dark dots can be formed. Therefore, the product quality can be guaranteed; the waste of production materials can be reduced; and the production cost can be greatly reduced.

At least one embodiment of the present invention provides an array substrate, which comprises: a base substrate, TFTs, an isolation layer and an organic resin layer formed on the base substrate, and a common electrode layer formed on the organic resin layer. The isolation layer covers source electrodes and drain electrodes of the TFTs; the organic resin layer covers the isolation layer and are provided with first through holes corresponding to the drain electrodes of the TFTs; the isolation layer is provided with second through holes communicated with the first through holes to expose partial drain electrodes; and the dimension of the second through holes is greater than that of the first through holes.

For instance, a thickness of the isolation layer is greater than that of the common electrode layer.

For instance, the isolation layer is provided with chamfer angles at positions, which make contact with the second through holes and are disposed beneath the organic resin layer.

For instance, the array substrate further comprises a passivation layer and a pixel electrode layer; the passivation layer is disposed on the common electrode layer and covers the common electrode layer; and the pixel electrode layer is disposed on the passivation layer.

For instance, the common electrode layer is also disposed at positions of the second through holes; parts of the common electrode layer disposed on the drain electrodes are not connected with parts of the common electrode layer disposed on the organic resin layer; and the passivation layer is connected with the isolation layer at the second through holes.

At least one embodiment of the present invention provides a method for manufacturing an array substrate. The method comprises: forming source electrodes and drain electrodes of TFTs on a base substrate; forming an isolation layer for covering the source electrodes, the drain electrodes and the base substrate from above the source electrodes and the drain electrodes; forming an organic resin layer and first through holes, corresponding to the drain electrodes of the TFTs, in the organic resin layer on the isolation layer; forming second through holes, communicated with the first through holes to expose partial drain electrodes, in the isolation layer, in which the dimension of the second through holes is greater than that of the first through holes; and forming a common electrode layer on the organic resin layer.

For instance, a thickness of the isolation layer is greater than that of the common electrode layer.

For instance, the method further comprises: forming a passivation layer on the common electrode layer; and forming a pixel electrode layer on the passivation layer.

For instance, the step of forming the second through holes, communicated with the first through holes to expose partial drain electrodes, in the isolation layer includes: forming the second through holes, communicated with the first through holes to expose partial drain electrodes, in the isolation layer by an etching process with an etching gas. For instance, the etching gas includes: sulfur hexafluoride, carbon tetrafluoride or trifluoromethane. For instance, a content of sulfur hexafluoride is 400 to 600 sccm; a content of carbon tetrafluoride is 400 to 600 sccm; and a content of trifluoromethane is 400 to 600 sccm.

For instance, the etching gas further includes: oxygen and helium gas. For instance, a content of the oxygen is 600 to 1,000 sccm; and a content of the helium gas is 300 to 500 sccm.

At least one embodiment of the present invention provides a display device, which comprises any foregoing array substrate provided by the first aspect.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

REFERENCE NUMERALS OF THE ACCOMPANYING DRAWINGS

1. Base Substrate; 2—Gate Electrode; 3—Gate Insulating Layer; 4—Active Layer; 5—Ohmic Contact Layer;

6—Source Electrode; 7—Drain Electrode; 8—Organic Resin Layer; 9—First Through Hole; 10—Isolation Layer; 11—Second Through Hole; 12—Common Electrode Layer; 13—Passivation Layer; 14—Pixel Electrode Layer.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Figure 1:
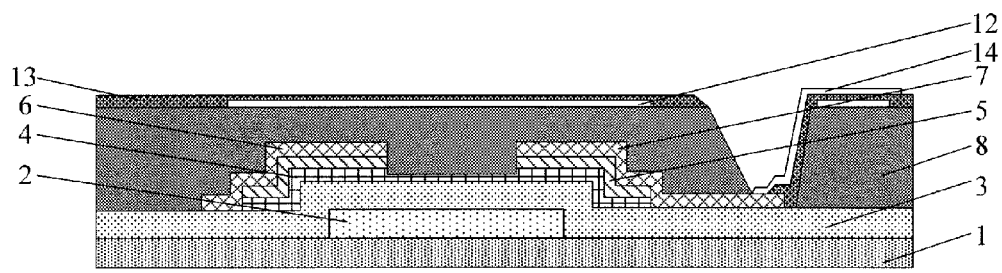
FIG. 1 is a schematic structural view of an array substrate of an HD display device.
Figure 2:
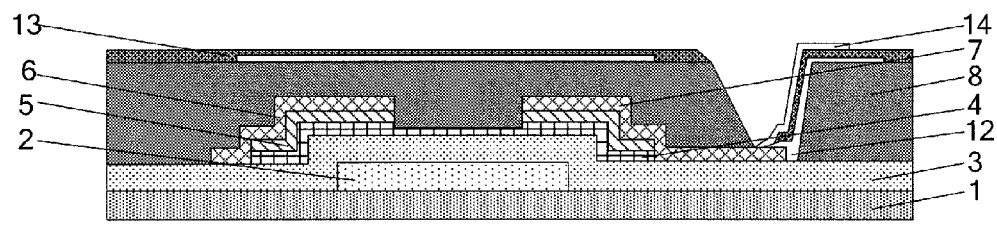
FIG. 2 is a schematic structural view of an array substrate of another HD display device.

FIG. 2 is a schematic structural view of an array substrate of another HD display device. The inventors have noted that: as for the array substrate as shown in FIG. 1, as the thickness of an organic resin layer 8 is relatively large, the thickness of photoresist at the through hole is relatively large in the photolithography process of a common electrode layer 12. As illustrated in FIG. 2, some areas at the through hole are not completely developed; a common electrode layer 12 is partially retained at the through hole; subsequently, a passivation layer 13 and a pixel electrode layer 14 are formed; the drain electrode 7 and the common electrode layer 12 may be electrically communicated with each other; and hence the common electrode layer 12 is communicated with the pixel electrode layer 14. When the power is applied, because the source electrode 6, the drain electrode 7 and the common electrode layer 12 are directly conducted, the common electrode layer 12 and the pixel electrode layer 14 are directly conducted; the voltage difference between the pixel electrode layer 14 and the common electrode layer 12 become zero; liquid crystal molecules are not rotated; the normal display of the sub-pixel function cannot be achieved; dark dots are formed; the product quality is severely affected, and defective products are produced; and hence the waste of production materials can be caused and the production cost has to be increased.

Figure 3:
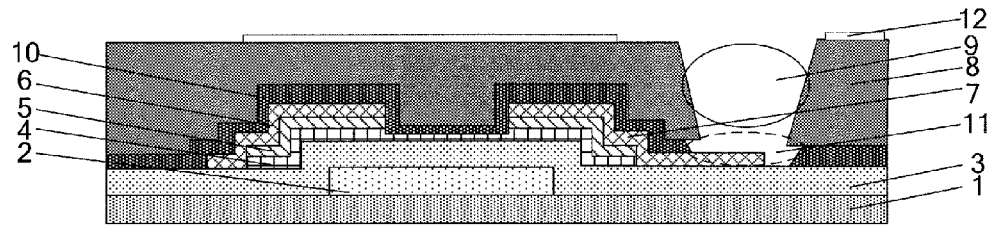
FIG. 3 is a schematic structural view of an array substrate provided by an embodiment of the present invention.

At least one embodiment of the present invention provides an array substrate. As illustrated in FIG. 3, the array substrate comprises: a base substrate 1, TFTs (each including a gate electrode 2, a gate insulating layer 3, an active layer 4, an ohmic contact layer 5, a source electrode 6 and a drain electrode 7), an isolation layer 10, and an organic resin layer 8 that are formed on the base substrate 1, and a common electrode layer 12 formed on the organic resin layer 8. First through holes 9 are formed in the organic resin layer 8.

The isolation layer 10 covers the source electrode 6 and the drain electrode 7 of each TFT; and the organic resin layer 8 completely covers the isolation layer 10. The isolation layer 10 is provided with second through holes 11 communicated with the first through holes 9 to expose part of drain electrodes 7, and the dimension of the second through holes 11 is greater than that of the first through holes.

The material of the isolation layer 10 may be an insulating material having large etch selectivity with respect to the source electrode, the drain electrode and the organic resin layer.

For instance, the material of the isolation layer 10 may be silicon nitride, silicon oxide, silicon oxynitride, etc. For instance, the isolation layer may be formed by chemical vapor deposition (CVD), and the thickness of the isolation layer may be 500 to 800 Å. The gate electrodes, the source electrodes and the drain electrodes of the TFTs may be formed by magnetron sputtering; the materials of the gate electrodes, the source electrodes and the drain electrodes may all be: a metallic material such as molybdenum (Mo), aluminum (Al) and copper (Cu), and may also be a composite structure of thin films made from any of the above several materials; the thickness of the gate electrodes may be 2,200 to 3,400 Å; and the thickness of the source electrodes and the drain electrodes may be 2,200 to 4,000 Å.

A thin film, the material of which is such as the silicon nitride, the silicon oxide and the silicon oxynitride, for covering the entire substrate may be deposited on the source electrodes and the drain electrodes by a CVD method. Subsequently, the isolation layer 10 provided with second through holes 11 as shown in FIG. 3 is formed by an etching process.

The gate insulating layer, the active layer and the ohmic contact layer may be formed by a CVD method. For instance, the gate insulating layer may be made from silicon nitride and the thickness of the gate insulating layer may be 3,600 to 4,400 Å; the active layer may be made from amorphous silicon (a-Si) and the thickness of the active layer may be 1,800 to 2,300 Å; and the ohmic contact layer may be made from doped a-Si and the thickness of the ohmic contact layer may be 400 to 700 Å. The organic resin layer may be formed by spin-coating and the thickness of the organic resin layer may be 20,000 to 30,000 Å; the common electrode layer may be made from indium tin oxide (ITO) or indium-doped zinc oxide (IZO) and may be formed by magnetron sputtering; and the thickness of the ITO common electrode layer is 300 to 500 Å.

In the array substrate provided by at least one embodiment of the present invention, an isolation layer is formed on source electrodes and drain electrodes of the array substrate and provided with second through holes, which are communicated with first through holes in an organic resin layer to expose partial drain electrodes and of which the dimension is greater than that of the first through holes. After a common electrode layer is formed on the organic resin layer, even if the electrode layers at the through holes are not completely etched, as for a transparent conductive film that is for forming the common electrode layer and deposited on the organic resin layer, because the transparent conductive film at the bottom of the through holes is not communicated with the transparent conductive film on both sides, the common electrode layer at the bottom of the through holes will not be connected with the common electrode layer on both sides. Thus, the common electrode layer will not be communicated with the drain electrodes, and hence the common electrode layer cannot be communicated with the pixel electrode layer. Therefore, the embodiment of the present invention can resolve the problem that: in an HD display device, drain electrodes will be communicated with a common electrode layer, and in turn the common electrode layer is communicated with a pixel electrode layer, and hence the normal display of the sub-pixel function cannot be achieved, and finally dark dots are formed. Moreover, the product quality can be guaranteed; defective products can be avoided; the waste of production materials can be reduced; and the production cost can be greatly reduced.

For instance, the thickness of the isolation layer 10 is greater than that of the common electrode layer 12.

The isolation layer 10 is formed with chamfer angles at positions, making contact with the second through holes 11 and being disposed beneath the organic resin layer 9.

Figure 5:
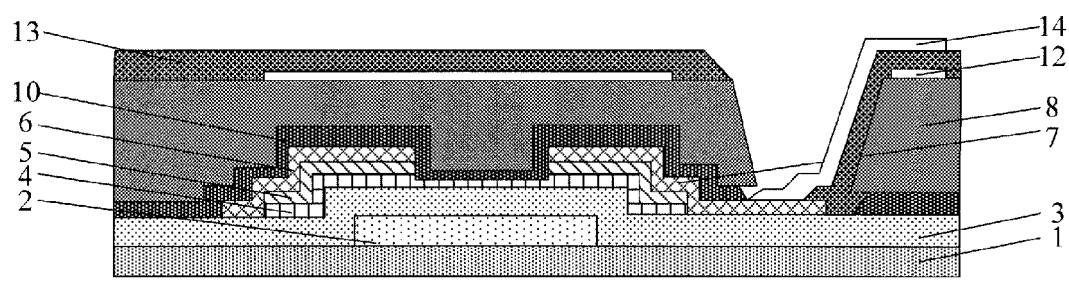
FIG. 5 is a schematic structural view of an array substrate provided by still another embodiment of the present invention.

When a thickness of the isolation layer is greater than that of the common electrode layer, the chamfer angles can further ensure that an opening as shown in FIG. 5 will be formed in the through holes by the material for forming the common electrode layer, and hence the normal display of the function of finally formed sub-pixels can be guaranteed.

For instance, the second through holes 11 formed on the isolation layer 10 are formed by etching with an etching gas or gases. The etching gas includes: sulfur hexafluoride ($SF_6$), carbon tetrafluoride ($CF_4$) or trifluoromethane ($CHF_3$).

Moreover, the etching gas may further include: oxygen ($O_2$) and helium gas (He).

For instance, the content of sulfur hexafluoride, the carbon tetrafluoride or the trifluoromethane may be 400 to 600 sccm (standard-state cubic centimeter per minute). For instance, the content of the oxygen may be 600 to 1,000 sccm; and the content of the helium gas may be 300 to 500 sccm.

The addition of $O_2$ into the etching gas can accelerate the surface oxidation of the material of the isolation layer and improve the etch rate of the isolation layer; and the addition of He into the etching gas can improve the etch uniformity, blow out intermediate products that are produced in the etching process from a reaction chamber, ensure the product quality, and hence ensure that the dimension of the second through holes is greater than that of the first through holes.

In at least one embodiment of the present invention, the common electrode layer may also be disposed at positions of the second through holes, and parts of the common electrode layer disposed on the drain electrodes are not connected with parts of the common electrode layer disposed on the organic resin layer.

A passivation layer is connected with the isolation layer at the second through holes.

Figure 4:
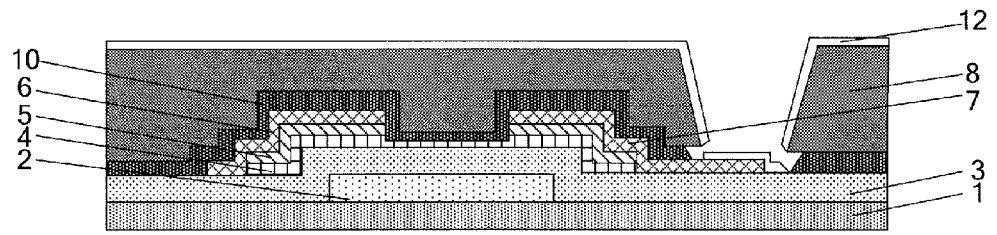
FIG. 4 is a schematic structural view of an array substrate provided by another embodiment of the present invention.
Figure 6:
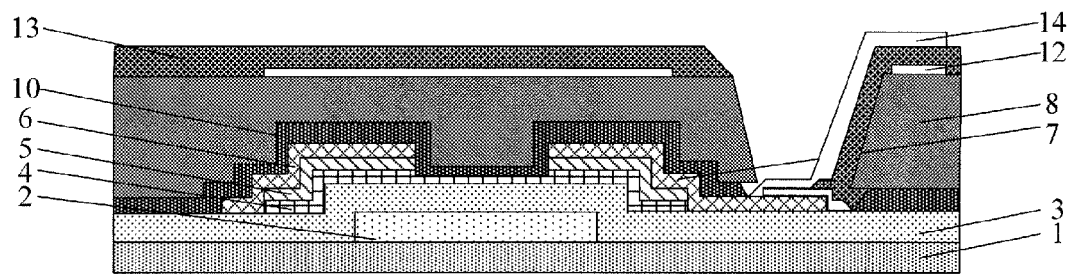
FIG. 6 is a schematic structural view of an array substrate provided by still another embodiment of the present invention.

For instance, the structure of a transparent conductive film for forming the common electrode layer on the organic resin layer is as shown in FIG. 4. As the dimension of the second through holes in the isolation layer is greater than that of the first through holes in the organic resin layer, as for the deposited transparent conductive film for forming the common electrode layer, the transparent conductive film at the bottom of the second through holes is not communicated with the transparent conductive film on both sides. Thus, after the common electrode layer is formed by patterning the transparent conductive film, when the passivation layer and the pixel electrode layer are formed subsequently, even if the parts of the transparent conductive film for forming the common electrode layer at the first through holes are not completely etched, after the passivation layer and the pixel electrode layer are finally formed, the source electrodes and the drain electrodes will not be communicated with the common electrode layer, and hence the common electrode layer would not be communicated with the pixel electrode layer. FIG. 6 illustrates the example in which the transparent conductive film for forming the common electrode layer at the second through holes is not completely etched. At this point, the transparent conductive film for forming the common electrode layer, communicated with the pixel electrode layer, may be equivalent for additionally extending a pixel electrode, so that the connectivity between the pixel electrode layer and the drain electrode can be enhanced. As the common electrode layer at the bottom of the second through holes is not communicated with the common electrode layer on both sides of the second through holes, the common electrode layer will not be communicated with the drain electrodes; the common electrode layer will not be communicated with the pixel electrode layer; the formed sub-pixels will not appear in dark dots; and the finally formed display panel will not suffer the problem of dark dots. Of course, even if the material of the common electrode layer in the entire through hole is not completely etched, as the structure as shown in FIG. 4 is provided after the deposition of the transparent conductive film of the array substrate provided by the embodiment, and the common electrode layer at the bottom of the second through hole is not communicated with the common electrode layer on both sides, the drain electrodes will not be communicated with the common electrode layer, and hence the pixel electrode layer would not be communicated with the common electrode layer.

Moreover, as illustrated in FIG. 5, the array substrate further comprises: a passivation layer 13 and a pixel electrode layer 14.

For instance, the passivation layer may be made from silicon nitride and the thickness of the passivation layer may be 2,500 to 4,500 Å; and the pixel electrode layer may be made from ITO or IZO, and the thickness of the pixel electrode layer may be 400 to 700 Å.

FIG. 5 is a schematic structural view of a finally formed array substrate when the material for forming the common electrode layer at the second through holes is completely etched.

At least one embodiment of the present invention provides a method for manufacturing an array substrate. The method comprises the following steps:

101: forming a gate metal layer including gate electrodes, gate lines and gate line leads on a base substrate.

For instance, a metal film having the thickness of 2,200 Å to 3,400 Å may be deposited on a base substrate (e.g., a glass substrate or a quartz substrate) by magnetron sputtering, may generally made from a metal such as molybdenum, aluminum, aluminum-nickel alloy, molybdenum-tungsten alloy, chromium and copper, and may also adopt a composite structure of thin films made from any of the above several materials. Then, the gate metal layer is formed in a specific region of the substrate via a mask by patterning processes such as exposure, development, etching and stripping.

102: forming a gate insulating layer on the gate metal layer.

For instance, a gate insulating layer film having the thickness of 3,600 Å to 4,400 Å may be deposited on the glass substrate by CVD. The material of the gate insulating film may be silicon nitride and may also be silicon oxide, silicon oxynitride, or the like.

103: forming source electrodes and drain electrodes on the gate insulating layer.

A metal film having the thickness of 2,200 Å to 4,000 Å, similar to the gate metal, is deposited on the substrate by the process similar to the process of forming the gate metal layer. The source electrodes and the drain electrodes are formed in specific regions by a patterning process.

104: forming an isolation layer for covering the source electrodes, the drain electrodes and the base substrate from above the source electrodes and the drain electrodes.

The material for the isolation layer may be a material that does not react with the material of the organic resin layer and are insulated from the material of the organic resin layer, and have large selectivity with respect to the source electrodes, the drain electrodes and the organic resin layer.

For instance, an isolation layer, covering the source electrodes and the drain electrodes and having the thickness of 500 to 800 Å, is deposited on the base substrate by CVD, and is generally made from silicon nitride, silicon oxide, silicon oxynitride, or the like.

105: forming an organic resin layer and first through holes in the organic resin layer on the isolation layer.

For instance, an organic resin layer having the thickness of 20,000 to 30,000 Å is coated on the substrate by spin-coating, and first through holes are formed in the organic resin layer by exposure and development.

106: forming second through holes, communicated with the first through holes to expose partial drain electrodes, in the isolation layer.

The dimension of the second through holes is greater than that of the first through holes.

For instance, the second through holes may be formed in the isolation layer by a certain proportion of etching gas by utilization of the blocking function of the material of the organic resin layer.

107: forming a common electrode layer on the organic resin layer.

For instance, an ITO or IZO common electrode layer, having the thickness of 300 to 500 Å and being formed after exposure, development and etching, is deposited by magnetron sputtering.

In the method for manufacturing the array substrate, provided by at least one embodiment of the present invention, the isolation layer is formed on the source electrodes and the drain electrodes of the array substrate and provided with the second through holes, which are communicated with the first through holes in the organic resin layer to expose partial drain electrodes and of which the dimension is greater than that of the first through holes. After the common electrode layer is formed on the organic resin layer, even the electrode layers at the through holes are not completely etched, as for the transparent conductive film that is for forming the common electrode layer and deposited on the organic resin layer, because the transparent conductive film at the bottom of the through holes is not communicated with the transparent conductive film on both sides, the common electrode layer at the bottom of the through holes will not be connected with the common electrode layer on both sides, so that the common electrode layer cannot be communicated with the drain electrodes, and hence the common electrode layer would not be communicated with the pixel electrode layer. Therefore, the embodiment of the present invention solves the problem that: in an HD display device, drain electrodes will be communicated with a common electrode layer, so that the common electrode layer is communicated with a pixel electrode layer, and hence the normal display of the sub-pixel function cannot be achieved, and finally dark dots are formed. Moreover, the product quality can be guaranteed; defective products can be avoided; the waste of production materials can be reduced; and the production cost can be greatly reduced.

At least one embodiment of the present invention provides a method for manufacturing an array substrate. The method comprises the following steps:

201: forming a gate metal layer including gate electrodes, gate lines and gate line leads on a substrate.

202: forming a gate insulating layer on the gate metal layer.

203: forming active layers on the gate insulating layer.

For instance, a metal oxide semiconductor film may be deposited on the gate insulating layer by CVD and is hence subjected to one patterning process to form active layers. That is to say, after being coated with photoresist, the substrate is subjected to exposure, development and etching via a common mask to form the active layers. The thickness of the active layer may be 1,800 to 2,300 Å.

204: forming an ohmic contact layer on the active layers.

For instance, an ohmic contact layer having the thickness of 400 to 700 Å is deposited by CVD, and the material of the ohmic contact layer may be doped a-Si material.

205: forming source electrodes, drain electrodes and data lines on the ohmic contact layer.

206: forming an isolation layer for covering the source electrodes, the drain electrodes and the substrate on the source electrodes and the drain electrodes.

For instance, the material of the isolation layer is an insulating material having large selectivity with respect to the source electrodes, the drain electrodes and the organic resin layer.

207: forming an organic resin layer and first through holes in the organic resin layer on the isolation layer.

208: forming second through holes, communicated with the first through holes to expose partial drain electrodes, in the isolation layer by an etching process with an etching gas.

The dimension of the second through holes is greater than that of the first through holes.

For instance, the etching gas includes: sulfur hexafluoride, carbon tetrafluoride or trifluoromethane. Moreover, the etching gas further includes: oxygen and helium gas. For instance, the content of sulfur hexafluoride, the carbon tetrafluoride or the trifluoromethane is all 400 to 600 sccm (standard-state cubic centimeter per minute); the content of the oxygen is 600 to 1,000 sccm; and the content of the helium gas is 300 to 500 sccm.

The addition of oxygen gas into the etching gas can accelerate the surface oxidation of the materials of the isolation layer and improve the etch rate of the isolation layer; and the addition of helium gas into the etching gas can improve the etch uniformity, blow out intermediate products produced in the etching process from a reaction chamber, and ensure the product quality.

209: forming a common electrode layer on the organic resin layer.

A thickness of the isolation layer is greater than that of the common electrode layer.

For instance, a common electrode layer having the thickness of 300 to 500 Å is deposited by magnetron sputtering. At this point, openings will be formed in the second through holes by the material for forming the common electrode layer.

210: forming a passivation layer for covering the active layers, the source electrodes, the drain electrodes and the data lines on the common electrode layer.

For instance, a passivation layer having the thickness of 2,500 Å to 4,500 Å is coated on the entire substrate by the process similar to that of the gate insulating layer and the active layers, and the material of the passivation layer is generally silicon nitride or a transparent organic resin material.

211: forming a pixel electrode layer on the passivation layer.

For instance, an ITO or IZO pixel electrode layer, having the thickness of 400 to 700 Å and being formed after exposure, development and etching, is deposited on the passivation layer by magnetron sputtering.

It should be noted that the description of the processes in the embodiment the same with the steps in the foregoing embodiment is similar to the description in the foregoing embodiment, so no further description will be given here.

At least one embodiment of the present invention provides a display device, which comprises the array substrate provided by any embodiment of the present invention. The display device may be any product or component having display function such as a mobile phone, a tablet PC, a TV, a notebook computer, a digital picture frame and a navigator.

In the display device provided by at least one embodiment of the present invention, the isolation layer is formed on the source electrodes and the drain electrodes of the array substrate of the display device and provided with the second through holes, which are communicated with the first through holes in the organic resin layer to expose partial drain electrodes and of which the dimension is greater than that of the first through holes. After the common electrode layer is formed on the organic resin layer, even if the electrode layers at the through holes are not completely etched, as for the transparent conductive film that is for forming the common electrode layer and deposited on the organic resin layer, as the transparent conductive film at the bottom of the through holes is not communicated with the transparent conductive film on both sides, the common electrode layer at the bottom of the through holes will not be connected with the common electrode layer on both sides, so that the common electrode layer cannot be communicated with the drain electrodes, and hence the common electrode layer cannot be communicated with the pixel electrode layer. Therefore, the embodiment of the present invention solves the problem that: in an HD display device, drain electrodes will be communicated with a common electrode layer, so that the common electrode layer is communicated with a pixel electrode layer, and hence the normal display of the sub-pixel function cannot be achieved, and finally dark dots are formed. Moreover, the product quality can be guaranteed; defective products can be avoided; the waste of production materials can be reduced; and the production cost can be greatly reduced.

The foregoing is only the preferred embodiments of the present invention and not intended to limit the scope of protection of the present invention. The scope of protection of the present invention should be defined by the appended claims.

The application claims priority to the Chinese patent application No. 201410415652.1, submitted on Aug. 21, 2014, the entire disclosure of which is incorporated herein by reference as part of the application.

The invention claimed is:

1. An array substrate, comprising: a base substrate, thin-film transistors (TFTs), an isolation layer and an organic resin layer formed on the base substrate, and a common electrode layer formed on the organic resin layer, wherein
the isolation layer covers source electrodes and drain electrodes of the TFTs; the organic resin layer covers the isolation layer and are provided with first through holes corresponding to the drain electrodes of the TFTs;
the isolation layer is provided with second through holes communicated with the first through holes to expose partial drain electrodes; and
the dimension of the second through holes is greater than that of the first through holes;
an acute angle is formed between a lower surface of the organic resin layer and a boundary of the isolation layer contacting the second through holes.

2. The array substrate according to claim 1, wherein a thickness of the isolation layer is greater than that of the common electrode layer.

3. The array substrate according to claim 1, further comprising a passivation layer and a pixel electrode layer, wherein
the passivation layer is disposed on the common electrode layer and covers the common electrode layer; and
the pixel electrode layer is disposed on the passivation layer.

4. The array substrate according to claim 3, wherein the common electrode layer is also disposed at positions of the second through holes; parts of the common electrode layer disposed on the drain electrodes are not connected with parts of the common electrode layer disposed on the organic resin layer; and
the passivation layer is connected with the isolation layer at the second through holes.

5. A display device, comprising the array substrate according to claim 1.

6. The array substrate according to claim 2, further comprising a passivation layer and a pixel electrode layer, wherein
the passivation layer is disposed on the common electrode layer and covers the common electrode layer; and
the pixel electrode layer is disposed on the passivation layer.

7. The array substrate according to claim 6, wherein the common electrode layer is also disposed at positions of the second through holes; parts of the common electrode layer disposed on the drain electrodes are not connected with parts of the common electrode layer disposed on the organic resin layer; and
the passivation layer is connected with the isolation layer at the second through holes.

8. The array substrate according to claim 1, further comprising a passivation layer and a pixel electrode layer, wherein
the passivation layer is disposed on the common electrode layer and covers the common electrode layer; and
the pixel electrode layer is disposed on the passivation layer.

9. The array substrate according to claim 8, wherein the common electrode layer is also disposed at positions of the second through holes; parts of the common electrode layer disposed on the drain electrodes are not connected with parts of the common electrode layer disposed on the organic resin layer; and
the passivation layer is connected with the isolation layer at the second through holes.

* * * * *